(12) United States Patent
Yang et al.

(10) Patent No.: US 7,489,072 B2
(45) Date of Patent: Feb. 10, 2009

(54) ORGANIC ELECTROLUMINESCENCE DISPLAY DEVICE AND METHOD FOR FABRICATING THE SAME

(75) Inventors: Joon-Young Yang, Gyeonggi-Do (KR); Jung-Il Lee, Seoul (KR)

(73) Assignee: LG. Display Co., Ltd., Seoul (KR)

( * ) Notice: Subject to any disclaimer, the term of this patent is extended or adjusted under 35 U.S.C. 154(b) by 508 days.

(21) Appl. No.: 11/208,242

(22) Filed: Aug. 18, 2005

(65) Prior Publication Data

US 2006/0273715 A1    Dec. 7, 2006

(51) Int. Cl.
*H01J 1/62* (2006.01)

(52) U.S. Cl. ............... 313/500; 313/505; 313/503; 313/504; 257/E51.022; 257/E51.001; 257/E51.005; 438/128; 438/129; 438/48; 438/99

(58) Field of Classification Search ......... 313/498–512; 315/169.1, 169.3; 428/690–691; 438/26–29, 438/34, 82; 257/40, 72, 98–100, 642–643, 257/759; 427/66, 532–535, 539; 445/24–25, 445/58, 64, 66
See application file for complete search history.

(56) References Cited

U.S. PATENT DOCUMENTS

| | | | | |
|---|---|---|---|---|
| 5,619,044 A | * | 4/1997 | Makita et al. ............. 257/64 |
| 6,605,483 B2 | * | 8/2003 | Victor et al. ............. 438/22 |
| 7,336,030 B2 | * | 2/2008 | Funamoto et al. ........ 313/506 |
| 2003/0127652 A1 | * | 7/2003 | Park et al. ............... 257/72 |
| 2004/0012028 A1 | * | 1/2004 | Park et al. ............... 257/88 |
| 2004/0195961 A1 | * | 10/2004 | Lin ..................... 313/504 |
| 2005/0073243 A1 | * | 4/2005 | Yamazaki et al. ......... 313/498 |
| 2005/0082968 A1 | * | 4/2005 | Choi et al. .............. 313/506 |
| 2005/0127367 A1 | * | 6/2005 | Huh et al. ............... 257/72 |
| 2005/0127825 A1 | * | 6/2005 | Bae et al. ............... 313/504 |
| 2005/0140290 A1 | * | 6/2005 | Park et al. .............. 313/512 |
| 2005/0181553 A1 | * | 8/2005 | Kim et al. ............... 438/166 |

* cited by examiner

*Primary Examiner*—Mariceli Santiago
*Assistant Examiner*—Donald L Raleigh
(74) *Attorney, Agent, or Firm*—Brinks Hofer Gilson & Lione

(57) ABSTRACT

An organic electroluminescence display device and a method for fabricating the same is described. The organic electroluminescence display device comprises pixels defined by a gate line and a data line perpendicular to the gate line, a switching device and a driving device formed in the unit pixel, a first power line, a transparent electrode layer and a conductive electrode layer for supplying a driving signal to the driving device, a storage electrode overlapped with the first power line such that an insulating layer is interposed therebetween, and an organic electroluminescence layer.

39 Claims, 15 Drawing Sheets

ORGANIC ELECTROLUMINESCENCE DISPLAY DEVICE AND METHOD FOR FABRICATING THE SAME

This application claims the benefit of priority to Korean patent application No.: 48563/2005, filed on Jun. 7, 2005, which is incorporated herein by reference.

TECHNICAL FIELD

The present application relates to an organic electroluminescence display device (OELD) and a method for fabricating the same, and an organic electroluminescence display device capable of reducing the number of processes and a method for fabricating the same.

BACKGROUND

An organic electroluminescence display device may be a passive matrix organic light emitting device (PMOLED), or an active matrix organic light emitting device (AMOLED) For a display device having a large area and a high resolution is required, the development of the AMOLED is desired.

An electroluminescence device is a spontaneous light emitting device for emitting light by electrically exciting a fluorescent organic compound. The electroluminescence display device can be driven at a low voltage and can be fabricated as a thin type. Also, the electroluminescence display device is being considered for use due to a wide optical viewing angle, a fast response speed, and other attributes.

In a electroluminescence device, electrons move to a light emitting layer through a cathode through an electron transfer layer. Holes move to the light emitting layer through an anode through another transfer layer. The electrons and the holes are coupled to each other in the light emitting layer, which is an organic material to form an exciton. As the exciton transitions to a low energy state, light is generated.

The generated light has different colors according to the selection of the organic material. The exciton can generate natural colors by using organic materials that emit R, G, and B colors.

An organic electroluminescence display device may further be categorized as a single-layer and a multi-layer structure. The single-layer device has a structure such that one light emitting layer is formed between an anode and a cathode as an organic layer, and the multi-layer has a structure such that a plurality of organic layers including a light emitting layer are formed between the anode and the cathode.

An organic electroluminescence display device of the multi-layer structure is being widely used because a driving voltage can be lowered since carriers are not directly injected into the light emitting layer.

A related art organic electroluminescence display device with a multi-layer structure is shown in FIG. 1.

The device comprises an anode 102, a cathode 101, and an organic electroluminescence layer 110 formed between the anode and the cathode.

The anode 102 is mainly formed of a transparent electrode such as an indium tin oxide (ITO). The cathode 101 is formed of a metal thin film such as Al, and reflects light generated at a light emitting layer.

Holes are supplied to a light emitting layer 104 through the anode 102, and electrons are supplied to the light emitting layer 104 through the cathode 101.

The organic electroluminescence layer 110 comprises the light emitting layer 104, an electron transfer layer 103, and a hole transfer layer 105. The electron transfer layer 103 is formed between the light emitting layer 104 and the cathode 101, and the hole transfer layer 105 is formed between the light emitting layer 104 and the anode 102.

The organic electroluminescence layer 110 is formed on a substrate 107 such as a transparent glass. On the substrate, a unit pixel having a matrix arrangement is formed. Also, at each unit pixel, an organic electroluminescence device having the above structure is formed. The organic electroluminescence display device having the multi-layer structure may comprise much more organic layers, and may further comprise an electron injection layer and a hole injection layer to lower a driving voltage.

A circuit diagram of the organic electroluminescence display device is shown in FIG. 2. M×N unit pixels are formed on an array substrate, and the unit pixel has a matrix arrangement. Each unit pixel 210 defined by the gate line 212 and data line 214 comprises a switching transistor 230, a driving transistor 240, a capacitor 220, and an organic electroluminescence display device 250 for receiving a signal from the driving transistor 240.

A gate electrode of the driving transistor 240 is turned on/off by the switching transistor 230, and the driving transistor 240 is thereby controller. The gate electrode of the driving transistor 240 is connected to a drain electrode of the switching transistor 230.

A source electrode of the driving transistor 240 is connected to a first power supply terminal Vdd of a first power line 216, and a drain electrode of the driving transistor 240 is connected to an anode of the organic electroluminescence device 250. Also, a cathode of the organic electroluminescence device 250 is connected to a second power supply terminal Vss. The organic electroluminescence device 250 is provided with at least one organic layer including an organic light emitting layer.

A plan view of a unit pixel of the organic electroluminescence display device is shown in FIG. 3. The unit pixel of the organic electroluminescence display device is defined by a gate line 301 and a data line 302 perpendicular to the gate line 301. At least one driving transistor 360 and at least one switching transistor 350 are formed in the unit pixel. The driving transistor 360 is controlled by the switching transistor 350.

A first power line 303 parallel with the data line 302 for applying a driving signal to the driving transistor 360 is formed at the unit pixel.

The switching transistor 350 is provided with a first active layer 304a constituting a channel thereof, a source electrode 302a, a drain electrode 310, and a gate electrode 301a.

The first active layer 304a is extended to be overlapped with the first power line 303, thereby forming one electrode 304b of a storage capacitor. The source electrode 302a is diverged from the data line 302 and is connected to the first active layer 304a through a contact hole. The drain electrode 310 is connected to the first active layer 304a through a contact hole, and one end thereof is connected to a gate electrode 306 of the driving transistor 360 through a contact hole. The gate electrode 301a is diverged from the gate line 301 and supplies a scan signal to the switching device.

The unit pixel of the organic electroluminescence display device is further provided with the driving transistor 360 for driving an organic electroluminescence layer constituting a pixel. The driving transistor 360 comprises a source electrode 303a diverged from the first power line 303, a second active layer 305, a first electrode 307 of the organic electroluminescence device, and a gate electrode 306.

The source electrode 303a is connected to the second active layer 305 through a connection pattern 309 and a contact hole. The first electrode 307 of the organic electroluminescence device serves as a drain electrode of the driving transistor, and is connected to the second active layer 305 through a contact hole. Also, the gate electrode 306 is connected to the drain electrode 310 of the switching transistor 350 and is controlled by the switching transistor 350.

When a scan signal is applied to the gate electrode 306 by the switching transistor, a channel of the second active layer 305 is opened and a driving signal is introduced into the second active layer 305 through the first power line 303. Accordingly, the organic electroluminescence layer of the organic electroluminescence device is driven.

The first active layer 304a and the second active layer 305 are formed on the same layer on the substrate, and the gate line 301 and the gate electrode 306 of the driving transistor are formed on the same line. Also, the first power line 303 is insulated from the active layers and the gate line 303 by an insulating layer, and is formed on an additional layer. The data line 302, the drain electrode 310, and the connection pattern 309 are formed on the same layer. The organic electroluminescence device having the organic electroluminescence layer comprises a first electrode 307 insulated from the data line 302, an organic electroluminescence layer 308 formed on the first electrode 307, and a second electrode (not shown) formed on the organic electroluminescence layer 308.

A sectional structure of the organic electroluminescence display device will be explained with reference to FIGS. 4A and 4B. FIG. 4A is a sectional view taken along line I-I in FIG. 3, which shows the organic electroluminescence display device.

Referring to FIG. 4A, a buffer layer 402 is formed on a substrate 401, and a first active layer 304a and a second active layer 305 are formed on the buffer layer 402. The first active layer 304a is extended to constitute one electrode of a storage capacitor overlapped with the first power line 303.

The active layers 304a and 305a are insulated by a first insulating layer 403, and the gate electrode 301a of the switching transistor 350 and the gate electrode 306 of the driving transistor 360 are formed on the first insulating layer 403.

The gate electrodes 301a and 306 are covered by a second insulating layer 404, and the first power line 303 is formed on the second insulating layer 404.

The first power line 303 is covered by the third insulating layer 405, and the data line 302, the source electrode 302a, the drain electrode 310, and the connection pattern 309 are formed on the third insulating layer 405.

The data line 302, the source electrode 302a, the drain electrode 310, and the connection pattern 309 are insulated by a fourth insulating layer 406, and are protected from outside.

FIG. 4B is a cross-sectional view taken along line II-II in FIG. 3, which shows the driving transistor of the unit pixel and the organic electroluminescence display device.

The organic electroluminescence device comprises a first electrode 307 on which an organic electroluminescence layer is formed and is connected to the second active layer 305, an organic electroluminescence layer 409 formed at a region defined by patterning a fifth insulating layer 407 formed on the fourth insulating layer 406, and a second electrode 408 formed on the organic electroluminescence layer 409.

As aforementioned, since the organic electroluminescence display device is provided with a plurality of thin film patterns, a number of photolithography processes are used which increases the cost of the organic electroluminescence display device.

DETAILED DESCRIPTION

Exemplary embodiments may be better understood with reference to the drawings, but these examples are not intended to be of a limiting nature. Like numbered elements in the same or different drawings perform equivalent functions.

Figure 1:
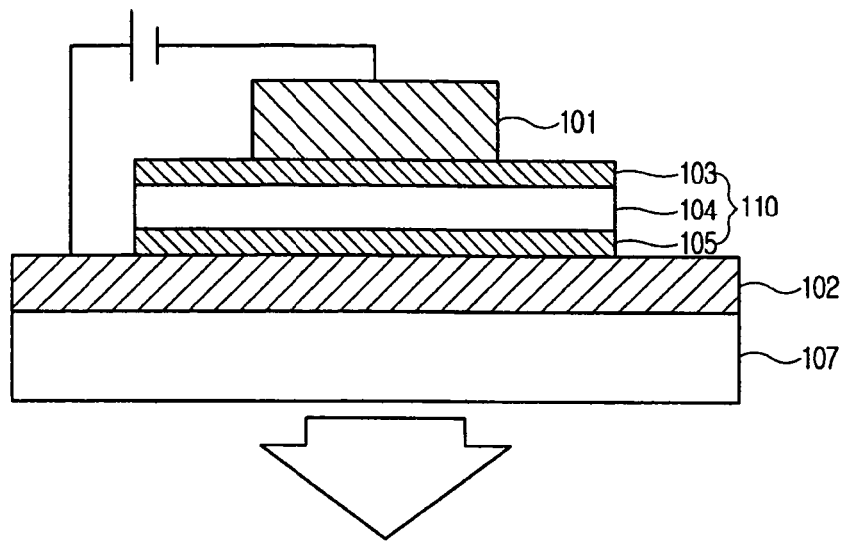
FIG. 1 is a sectional view showing a structure of an organic electroluminescence display device in accordance with the related art.
Figure 2:
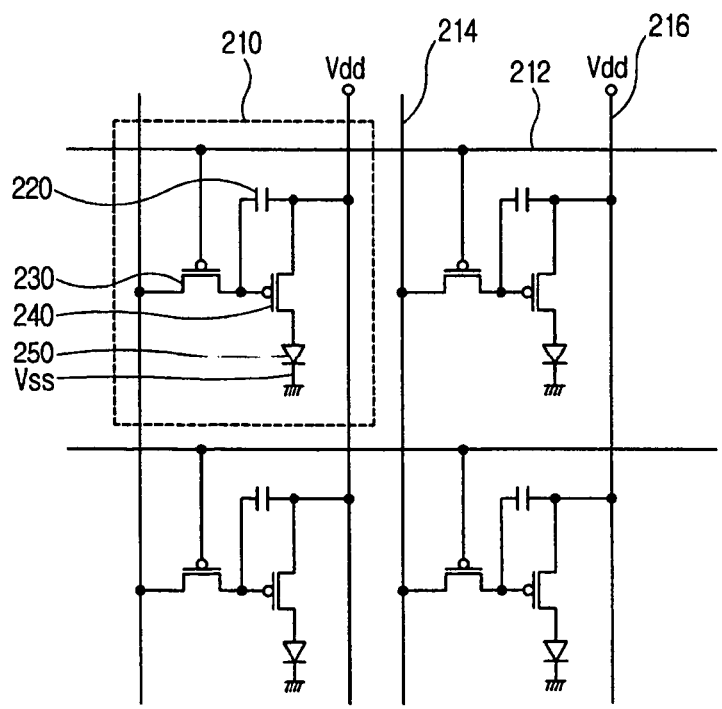
FIG. 2 is a circuit diagram showing a unit pixel of the organic electroluminescence display device in accordance with the related art.
Figure 3:
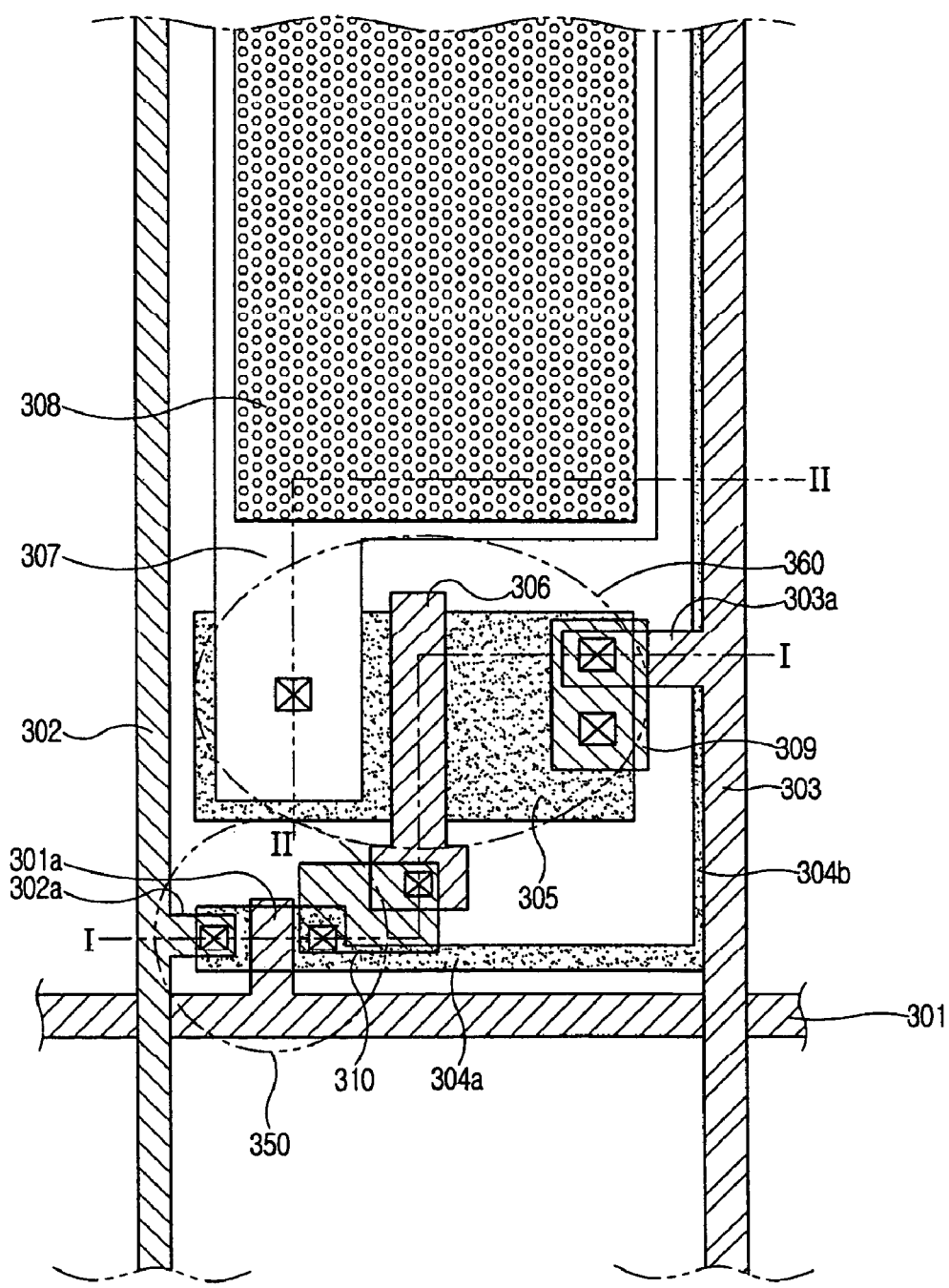
FIG. 3 is a plan view showing the unit pixel of the organic electroluminescence display device in accordance with the related art.
Figure 4A:
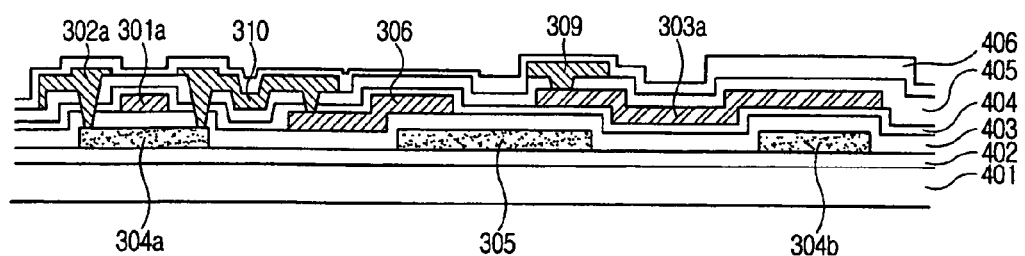
FIG. 4A is a sectional view taken along line I-I in FIG. 3, which shows the unit pixel of the organic electroluminescence display device in accordance with the related art.
Figure 4B:
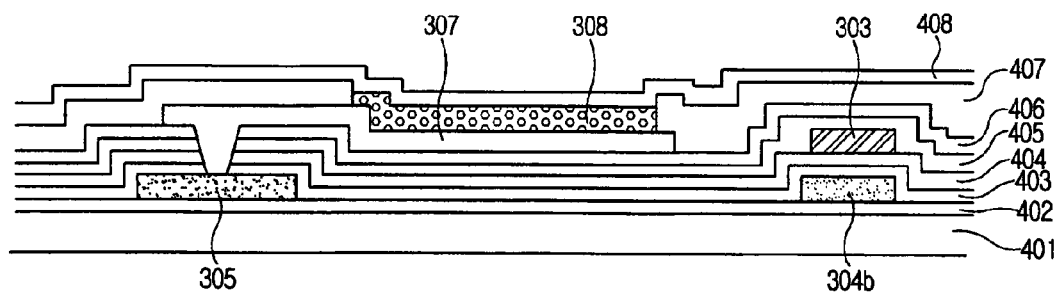
FIG. 4B is a sectional view taken along line II-II in FIG. 3, which shows the unit pixel of the organic electroluminescence display device in accordance with the related art.
Figure 5:
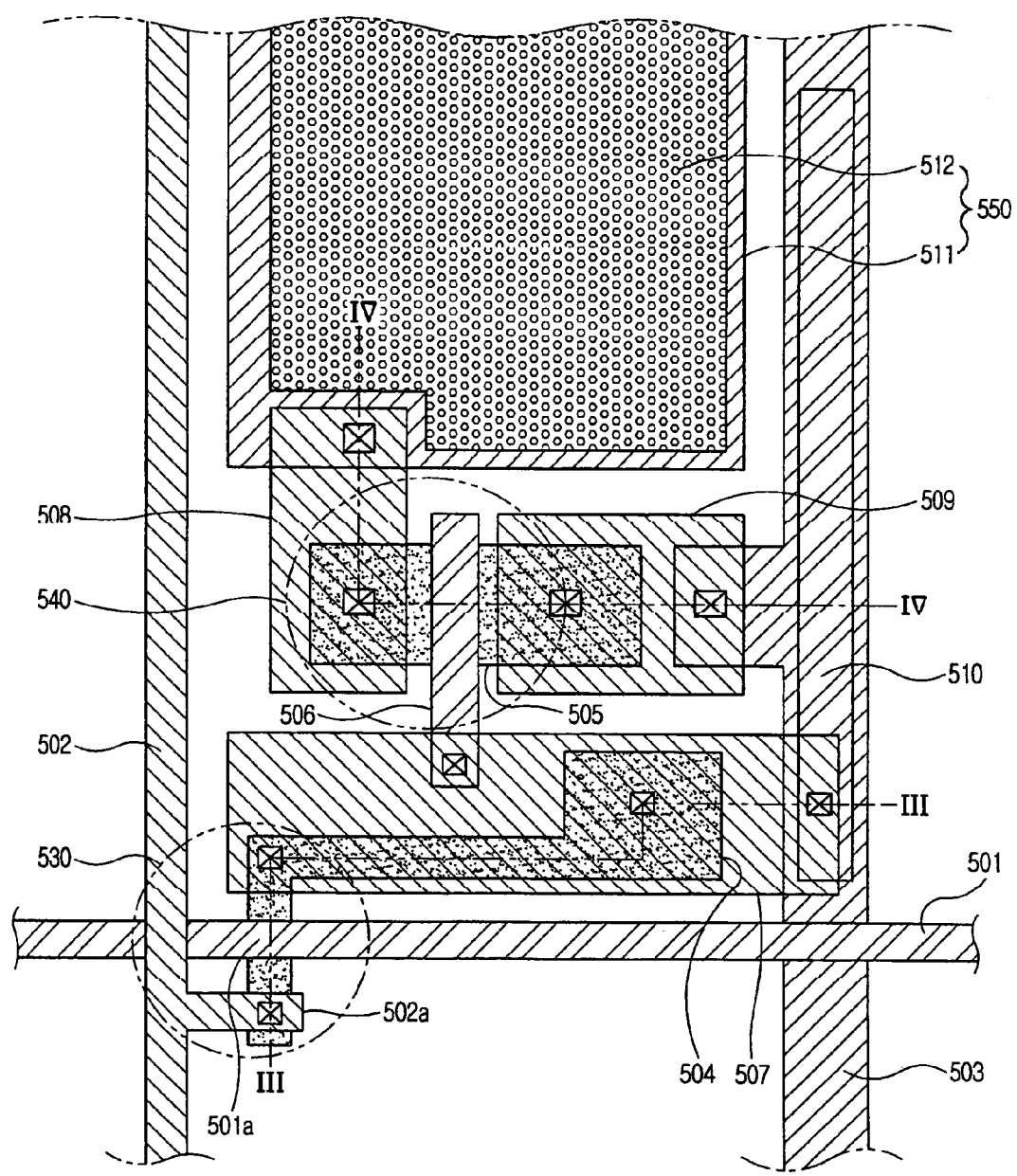
FIG. 5 is a plan view showing a unit pixel of an organic electroluminescence display device.
Figure 6A:
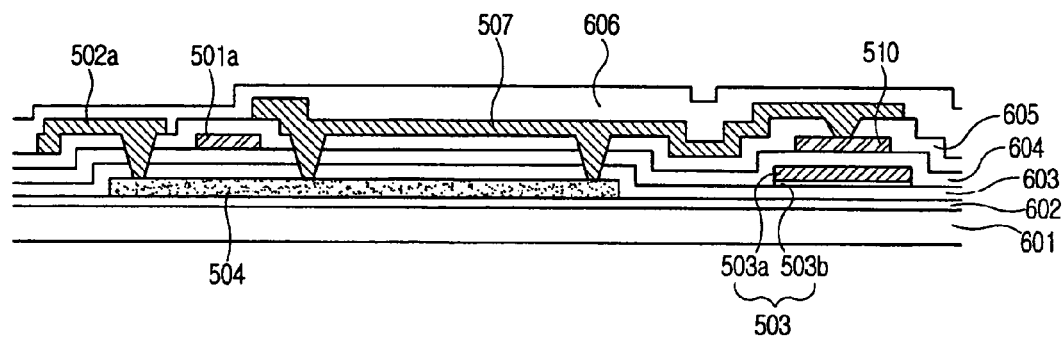
FIG. 6A is a cross-sectional view taken along line III-III in FIG. 5, which shows the unit pixel of the organic electroluminescence display device.
Figure 6B:
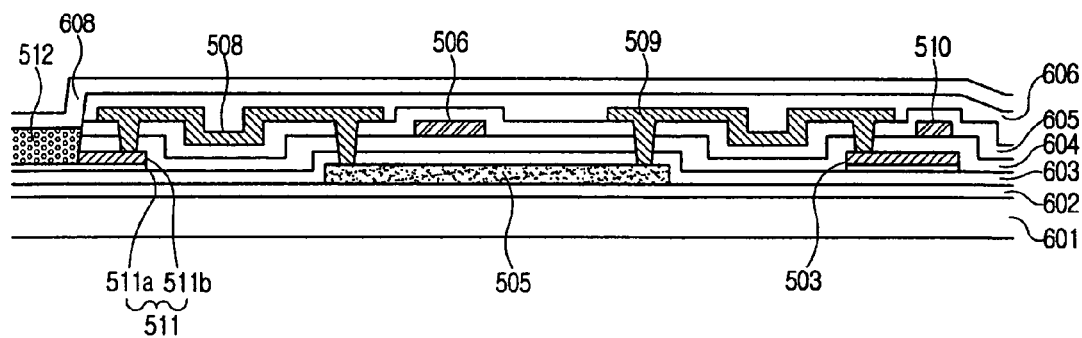
FIG. 6B is a cross-sectional view taken along line IV-IV in FIG. 5, which shows the unit pixel of the organic electroluminescence display device.

FIG. 5 is a plan view showing a unit pixel of an organic electroluminescence display device, and FIGS. 6A and 6B are sectional views taken along line III-III and IV-IV in FIG. 5 A unit pixel is defined by a gate line 501 and a data line 502 perpendicular to the gate line 501. An organic electroluminescence device 550 having an organic electroluminescence layer is formed in the unit pixel. A switching device 530 connected to the gate line 501 and the data line 502 and a driving device 540 controlled by the switching device are formed in the unit pixel. The switching device 530 and the driving device 540 may be thin film transistors.

A first power line 503 is disposed parallel to the data line 502, and is connected to the driving device 540. A first active pattern 504 and a second active pattern 505 constituting channels of the switching device 530 and the driving device 540, respectively, are formed. The active patterns may be formed of a poly-silicon. The active patterns 504 and 505 each comprise source and drain regions on which impurity ions are doped.

A storage electrode 510 overlapped with the first power line 503 to form a storage capacitor is provided at an upper portion of the first power line 503.

A first connection pattern 507 for connecting a drain region of the first active pattern 504, a gate electrode 506 of the driving device, and the storage electrode 510, a second connection pattern 509 for connecting a source region of the second active pattern 505 to the first power line 503, and a third connection pattern 508 for connecting a drain region of the second active pattern 505 to the organic electroluminescence device 550 are formed.

The organic electroluminescence portion 550 may have an organic electroluminescence layer and electrodes. Electrodes are formed at both facing surfaces of the organic electroluminescence portion.

A first electrode 511 is connected to the driving device 540 by the third connection pattern 508, and the first electrode 511 may be formed of a plurality of layers. of stacked layers, including a transparent electrode 511a such as ITO and a conductive layer 511b such as Al. The first electrode 511 and the first power line 503 may have the same stacked structure, and may be formed on the same layer.

The conductive layer 511b on the transparent electrode layer 511a is removed so that the transparent electrode layer 511a can be exposed. The transparent electrode layer 511a is exposed in the middle portion of the first electrode 511, and peripheral edges of the first electrode 511 have a stacked structure including the transparent electrode layer 511a and the conductive layer 511b thereby to form a bank along the periphery. Accordingly, the organic electroluminescence portion 550 has an organic electroluminescence layer region defined by an edge of the bank, and an organic electroluminescence layer 512 is formed at the organic electroluminescence layer portion 550 (see FIG. 6B). Therefore, the organic electroluminescence layer 512 has the transparent electrode layer 511a as portion of one electrode, and edges thereof are substantially surrounded by the bank formed as the transparent electrode layer 511a and the conductive layer 511b are stacked. In another embodiment, the conductive layer 511b may be completely removed rather than leaving a bank. In this case, only the transparent electrode layer remains.

A second electrode (not shown) constituting another electrode of the organic electroluminescence device is further provided on the organic electroluminescence portion 550. The first electrode 511 may be an anode, and the second electrode may be a cathode. The electrodes may have opposite polarities to the above polarities according to a kind of the driving device, that is, a P type TFT or an N type TFT of the driving device.

A cross-sectional structure of the unit pixel is shown in FIGS. 6A and 6B. The first active pattern 504 and the second active pattern 505 are formed on a substrate 601. A buffer layer 602 formed of a silicon nitride layer or a silicon oxide layer for protecting the active patterns 504 and 505 formed of poly-silicon is further provided on the substrate 601, and the active patterns 504 and 505 are formed on the buffer layer 602. The first active pattern 504 and the second active pattern 505 are covered by a first insulating layer 603.

The first power line 503 and the first electrode 511 of the organic electroluminescence device are formed on the substrate 601 having the first insulating layer 603 covering the active patterns 504 and 505. The first power line 503 and the first electrode 511 may have a double layer structure formed of a transparent electrode 511a such as ITO and a conductive layer 511b such as Al. The transparent electrode 511a may form the first electrode of the organic electroluminescence device, and the conductive layer 511b may form a conductive line of the first power line 503. The active patterns, the first power line 503, and the conductive layer 511b are covered by a second insulating layer 604.

The storage electrode 510 may be overlapped with the first power line 503 to form a storage capacitor and the gate line 501 are formed on the second insulating layer 604. The storage electrode 510 and the gate line 501 may be formed on the same second insulating layer 604. The portion of the gate line that overlaps the first active pattern 504 forms a gate electrode 501a of the switching device. The gate line 501 and the storage electrode 510 are covered by a third insulating layer 605.

A plurality of contact holes may be formed on the insulating layers to expose the active patterns 504 and 505, the storage electrode 510, and the first electrode 511 of the organic electroluminescence device. The plurality of contact holes comprise contact holes for exposing the source and drain regions of the first active pattern 504 and the second active pattern 505, the storage electrode 510, the gate electrode 506 of the driving device 540, the first power line 503, and the first electrode 511.

A plurality of connection patterns are formed on the second insulating layer 605 on which the contact holes are formed. That is, the first connection pattern 507 for connecting the drain of the first active pattern 504, the gate electrode 506 of the driving device, and the storage electrode 510, the second connection pattern 509 for connecting the first power line 503 to the source of the second active pattern 505, and the third connection pattern 508 for connecting the drain of the second active pattern 505 to the first electrode 511 of the organic electroluminescence device are formed on a fourth insulating layer 605. The data line 502 connected to the source of the first active pattern 504 may be provided on the third insulating layer 605.

As the switching device 530 is operated by the gate line 501 and the data line 502, the gate electrode 506 of the driving device 540 is operated and a driving signal is supplied to the organic electroluminescence display portion 550 from the first power line 503.

The data line 502 and the plurality of connection patterns are covered by a fifth insulating layer 606.

The organic electroluminescence portion is provided with electrodes at both facing surfaces thereof, and an organic electroluminescence layer 512 is provided between the electrodes.

FIG. 6B is a sectional view taken along line IV-IV in FIG. 5.

The organic electroluminescence device includes a first electrode 511, an organic electroluminescence layer 512 connected to the first electrode 511, and a second electrode 608 formed on the organic electroluminescence layer 512.

The second electrode 608 is formed of an opaque metal layer such as Al, and a conductive layer 511b of the first electrode 511 is removed so that light generated from the organic electroluminescence layer 512 may be transmitted to outside through the substrate 601.

The first electrode 511 is formed of a plurality of layers including a transparent electrode layer 511a and a conductive layer 511b. A portion of the layers, which may include conductive layer 511b overlaying the transparent electrode layer 511a, are removed so that light generated from the organic electroluminescence layer 512 can be transmitted to outside.

Only a middle portion of the conductive layer 511b may be removed so that a bank formed as the transparent electrode layer 511a and the conductive layer 511b are stacked can be formed at the peripheral edge of the organic electroluminescence layer 512. A width of the bank is preferably formed to be narrow thereby to increase an aperture ratio.

The bank defines a periphery of an organic electroluminescence layer to be formed subsequently, and collects light generated from the organic electroluminescence layer 512 so that the light can be transmitted a perpendicular surface to the substrate 601.

Since the organic electroluminescence layer 512 is formed only in a concave portion defined by the bank and on top of the transparent electrode layer 511a, light is not leaked laterally but may be directed perpendicular to surface to the substrate 601 surface.

The organic electroluminescence layer 512 is formed on the first electrode 511 including the bank, and a second electrode 608 is formed on the organic electroluminescence layer 512. The organic electroluminescence layer 512 may be formed of a plurality of layers such as an organic electroluminescence layer, an electron transfer layer, a hole transfer layer, an electron transmit layer, and a hole transmit layer (not separately shown).

A method for fabricating an organic electroluminescence display device will be described with reference to FIGS. 7A to 7E and FIGS. 8A to 8E.

FIGS. 7A to 7E are views corresponding to the cross-sectional view of FIG. 6, and FIGS. 8A to 8E are views corresponding to the plan view of FIG. 6.

Figure 7A:
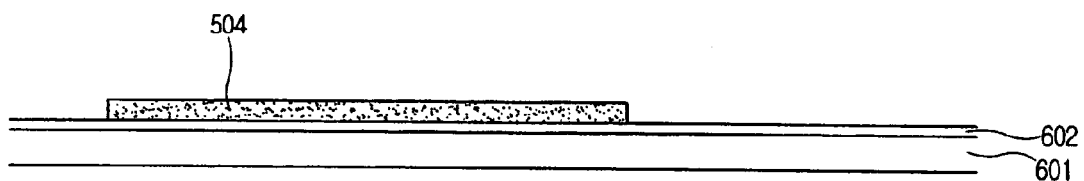
FIGS. 7A to 7E are cross-sectional views showing a method for fabricating an organic electroluminescence display device with regard to the sectional view of FIG. 6A.

As shown in FIG. 7A, a buffer layer 602 may be formed of a silicon oxide layer or a silicon nitride layer on a transparent substrate 601. When a silicon layer formed on the buffer layer 602 is crystallized, the buffer layer 602 prevents impurities of the substrate from being introduced into the silicon layer.

Then, active patterns of a switching device and a driving device are formed on the buffer layer 602. The formation of an active pattern may include forming an amorphous silicon layer on the buffer layer, crystallizing the amorphous silicon layer, and patterning the crystallized silicon layer. The amorphous silicon layer may be formed on the buffer layer 602 by, for example, a plasma chemical vapor deposition method (PECVD). The amorphous silicon layer is crystallized, for example, by a heating method, a laser crystallization method, or a fast heating method (RTA). Preferably, the laser crystallization method having a small grain boundary is used.

By using the laser crystallization method, the silicon layer has a high electric mobility and may result in a switching device and a driving device suitable for a fast operation.

The crystallized silicon is patterned by a photolithography process. As a result of the patterning, a first active pattern 504 and a second active pattern 505 are formed.

FIG. 8 are plan views of the active patterns 504 and 505. The first active pattern 504 and the second active pattern 505 are formed at each unit pixel.

Figure 7B:
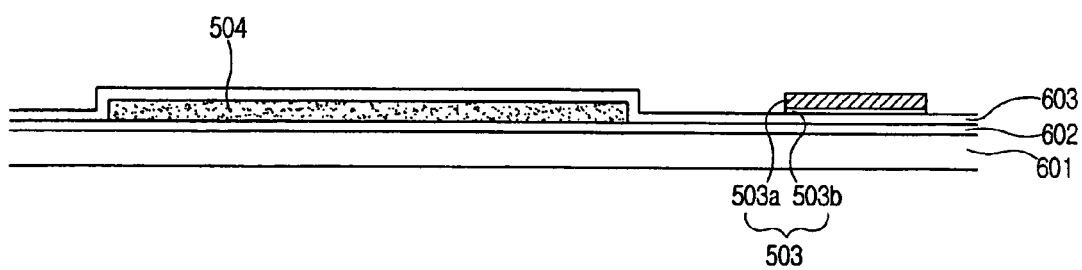
Figure 8A:
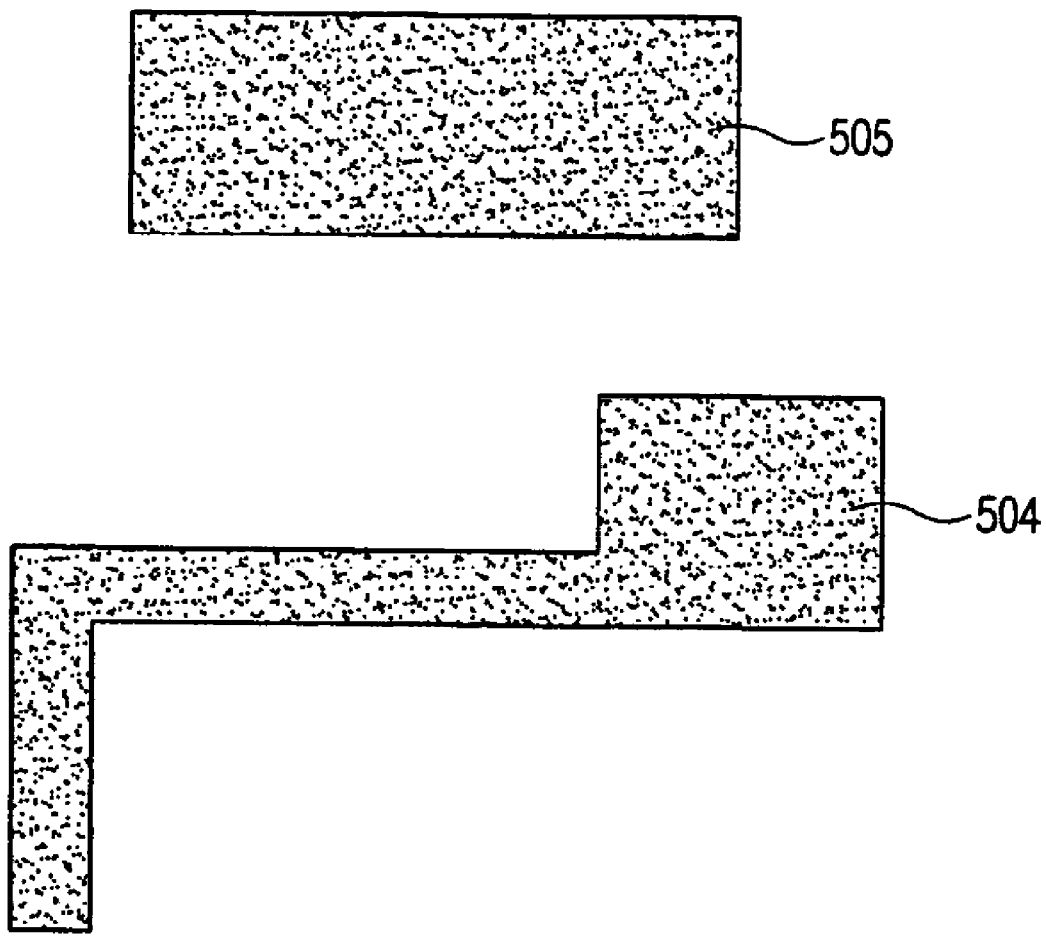
FIGS. 8A to 8E are plan views showing the method for fabricating an organic electroluminescence display device.
Figure 8B:
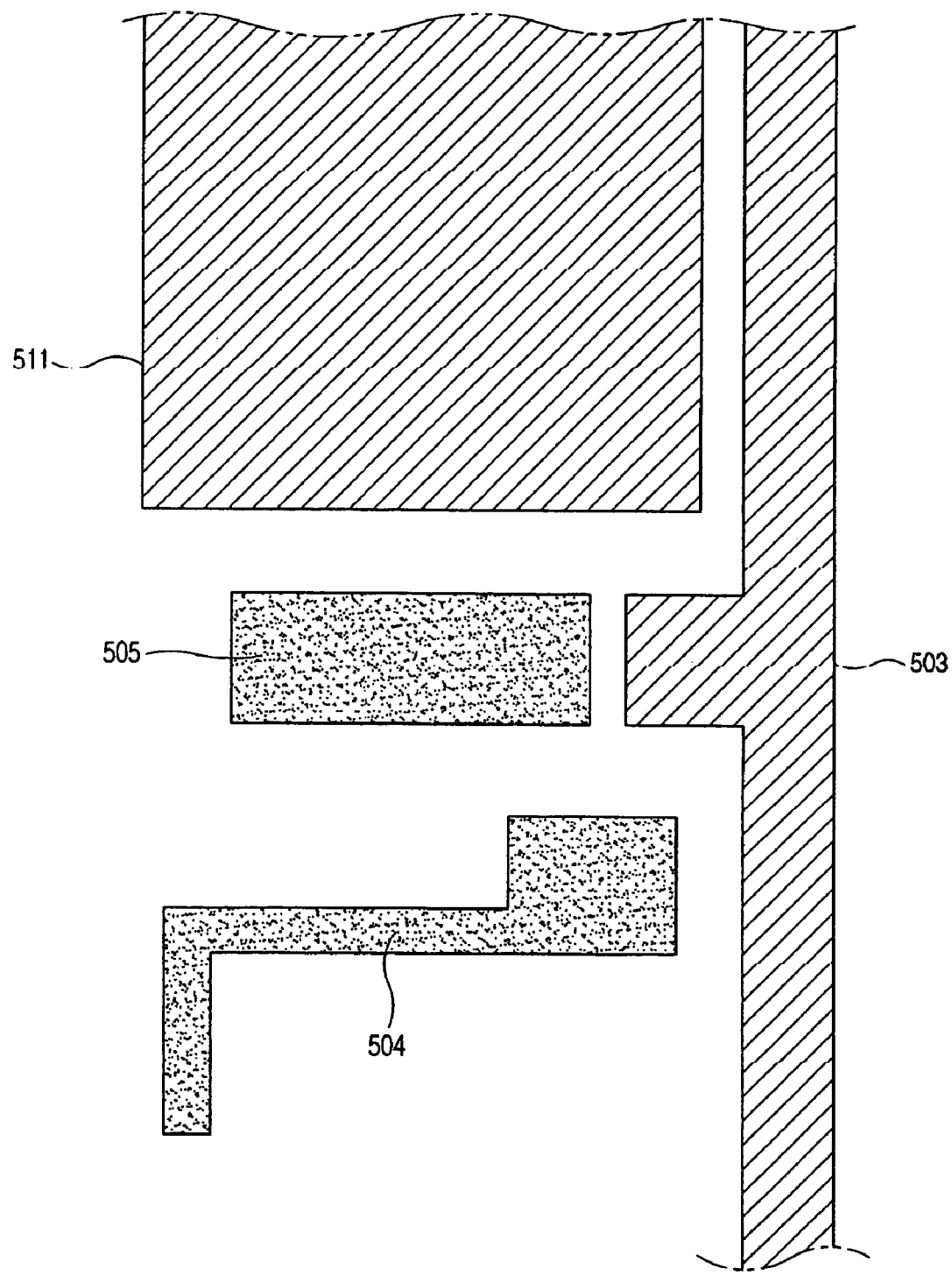

As shown in FIGS. 7B and 8B, a first insulating layer 603 covering the active patterns 504 and 505 is formed on the substrate 601 and a first power line 503 and a first electrode 511 of an organic electroluminescence device is formed on the first insulating layer 603.

The first power line 503 and the first electrode 511 may be formed by stacking a transparent electrode material and a conductive layer.

As shown in FIG. 8B, forming the first power line 503 and the first electrode 511 includes forming a transparent electrode layer 503a such as ITO on the first insulating layer 603, for example, by a sputtering method, forming a conductive layer 503a such as Al on the transparent electrode layer 503b, and patterning the stack by a photolithography process.

Figure 7C:
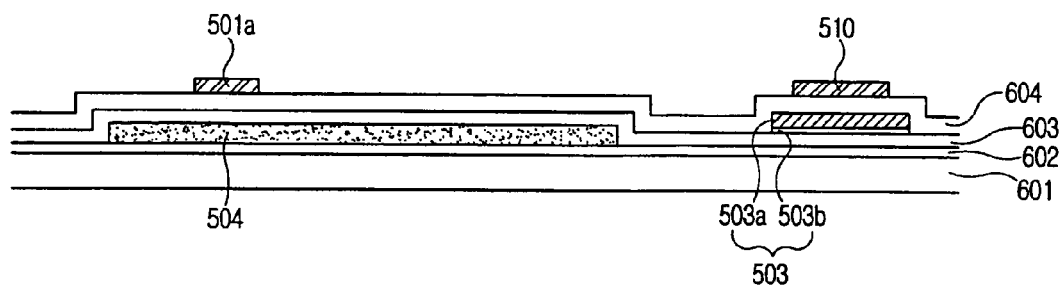
Figure 8C:
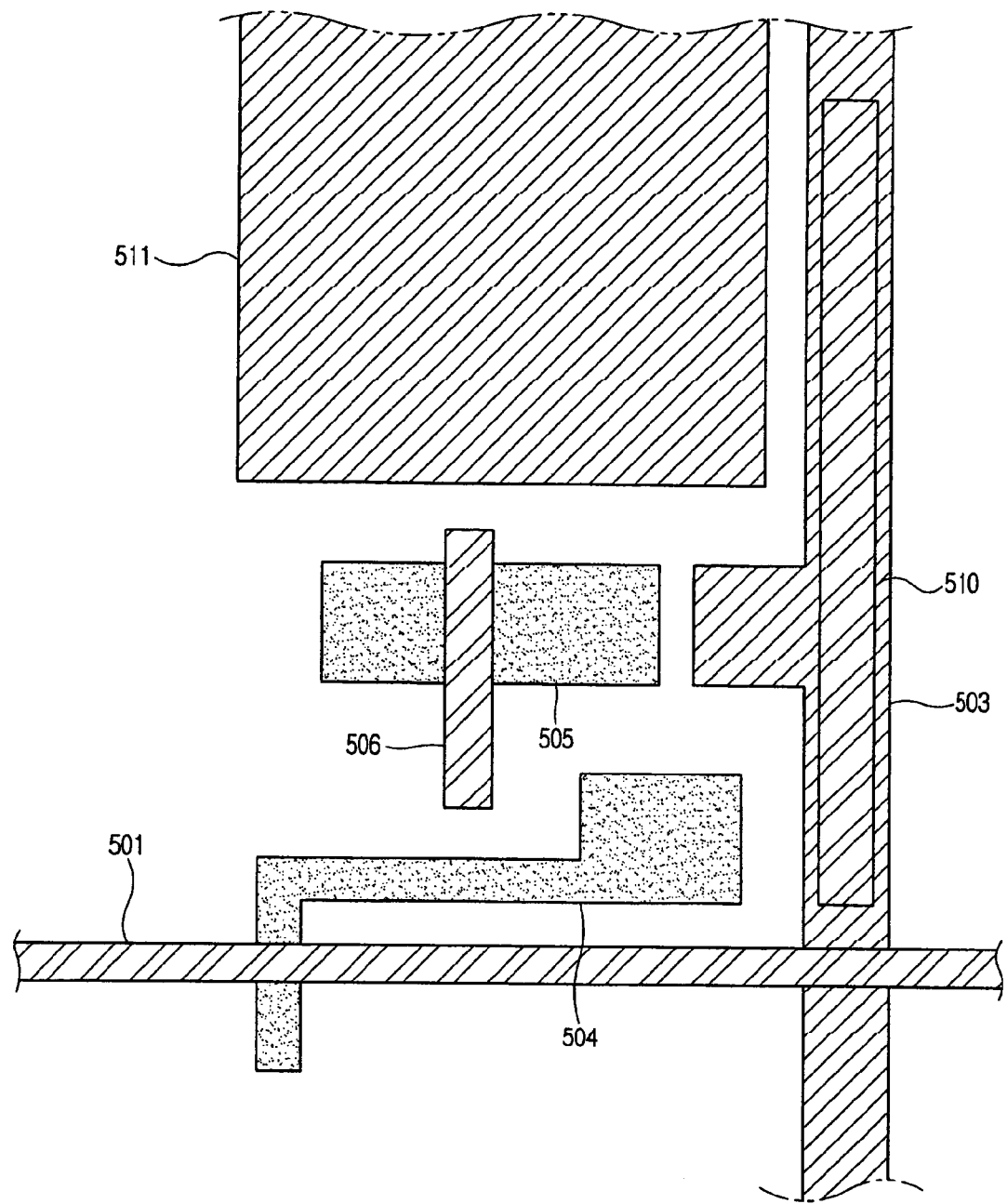

As shown in FIGS. 7C and 8C, a second insulating layer 604 covering the first power line 503 and the first electrode 511 may be formed. The second insulating layer 604 may be formed by vapor-depositing a silicon nitride or a silicon oxide.

A gate line 501, a gate electrode 506 of a driving device, and a storage electrode 510, overlapped with the first power line 503, are formed on the second insulating layer 604. The formation of the gate line 501, the gate electrode 506, and the storage electrode 510 may include sputtering a metal layer on the second insulating layer 604, and photo-lithographing the metal layer.

A third insulating layer 605 for covering the gate line 501, the gate electrode 506, and the storage electrode 510 may be formed, and a contact hole is formed.

Figure 7D:
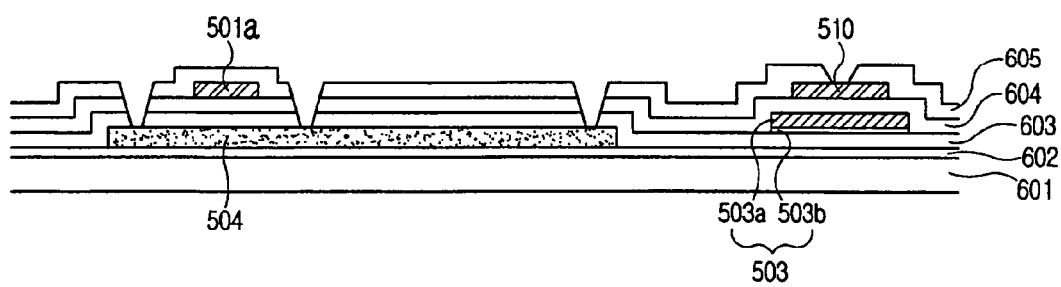
Figure 8D:
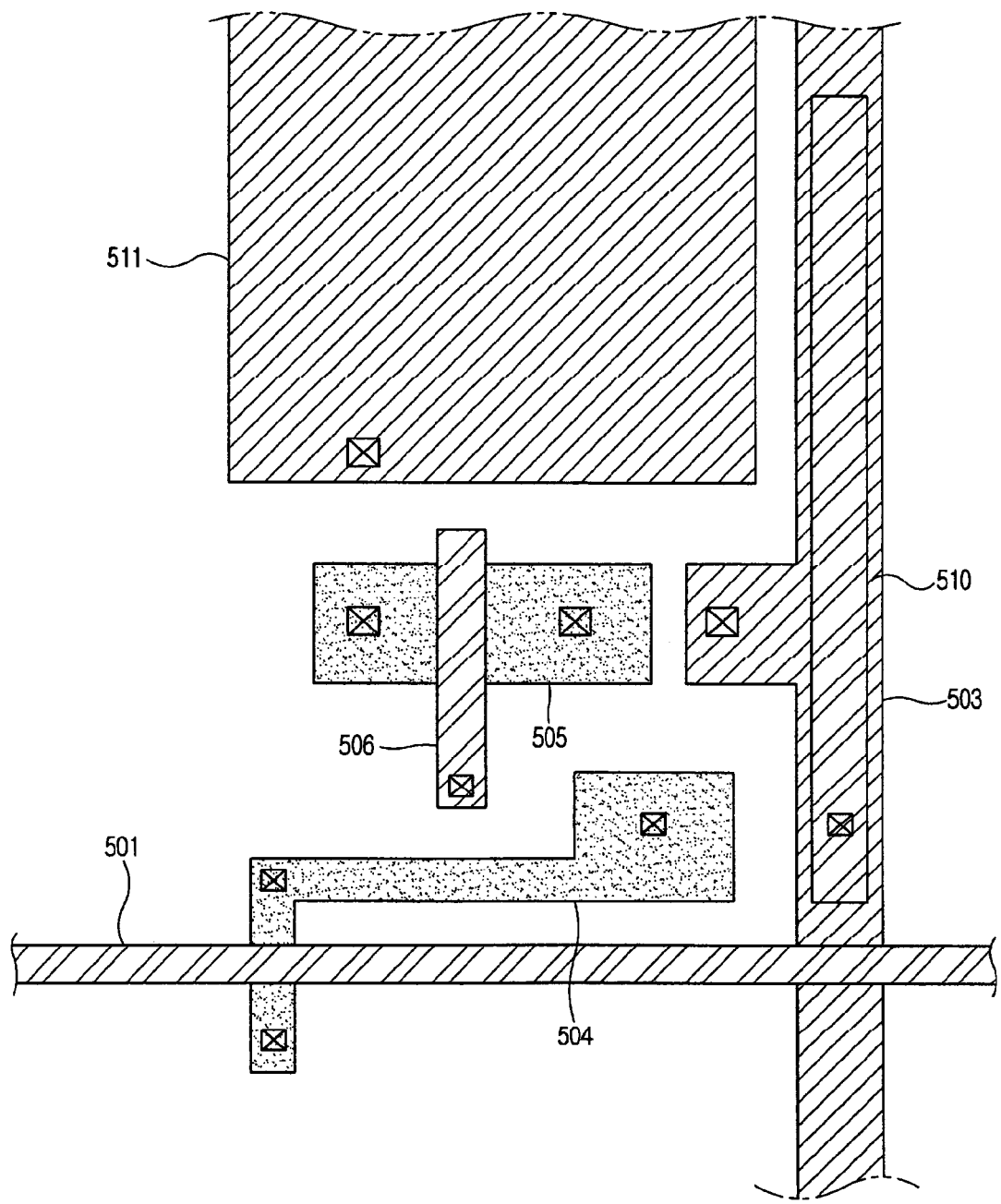

FIGS. 7D and 8D illustrate the formation of a contact hole. A photoresist layer is deposited on the third insulating layer 605, a mask is aligned, and an exposure is performed, thereby defining a contact hole pattern. The contact hole pattern can be formed by exposing and developing the photoresist. By using the contact hole pattern as a mask, the insulating layers 603, 604 and 605 may sequentially etched, to expose source/drain regions of the first active pattern 504 and the second active pattern 505, the storage electrode 510, the gate electrode 506, the first power line 503, and the first electrode 511 of the organic electroluminescence device.

A data line 502 and a plurality of connection patterns are formed on the third insulating layer 605.

The connection patterns include a first connection pattern 507 for connecting the drain region of the first active pattern 504, the gate electrode 506, and the storage electrode 510; a second connection pattern 509 for connecting the second active pattern 505 to the first power line; and, a third connection pattern 508 for connecting the drain region of the second active pattern 505 to the first electrode 511 of the organic electroluminescence device.

Forming the connection patterns and the data line 502 may include sputtering a conductive layer on the second insulating layer 605 including a contact hole, and photo-lithographing the conductive layer.

Figure 8E:
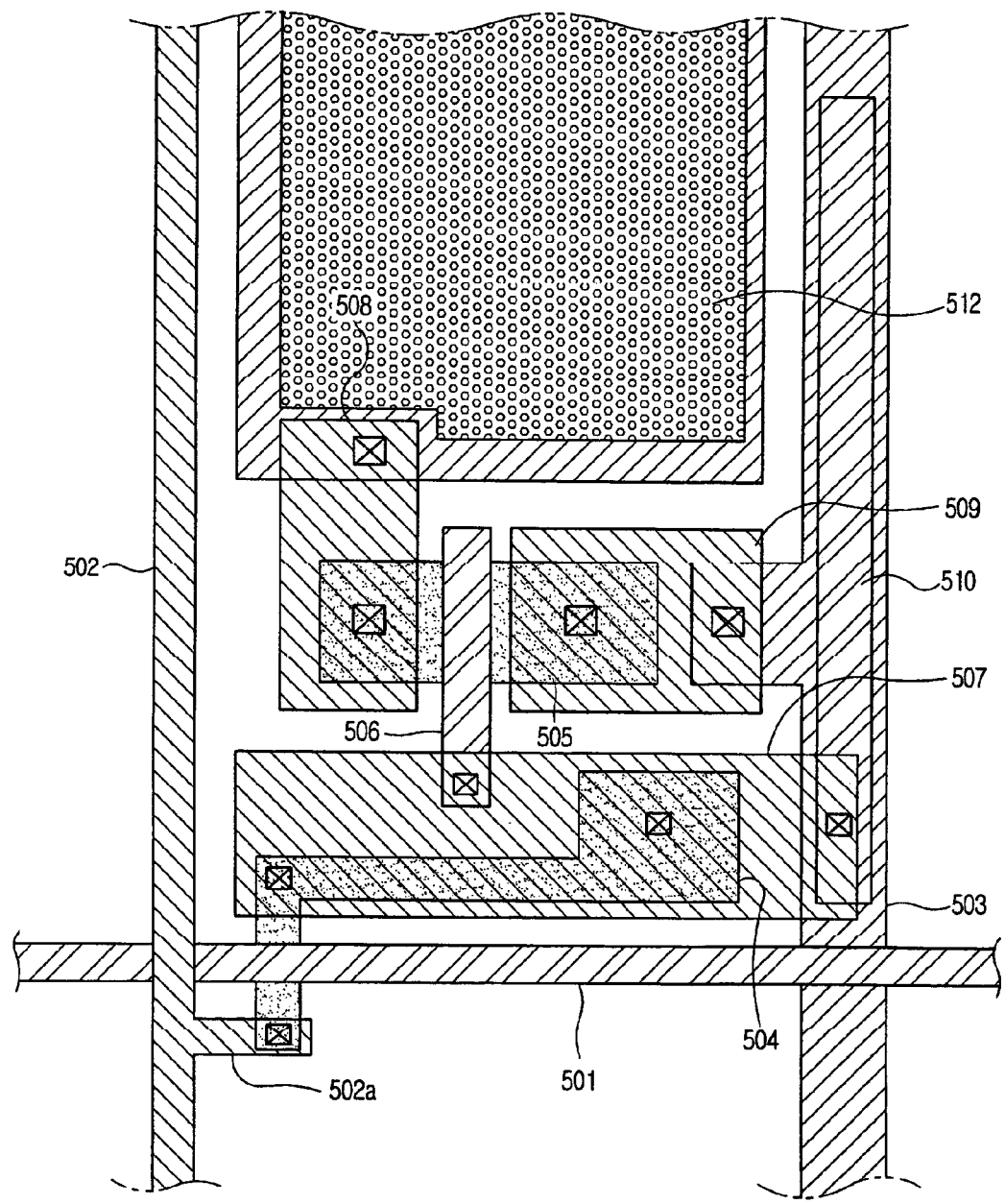

FIG. 8E is a plan views of the connection patterns and the data line.

Figure 7E:
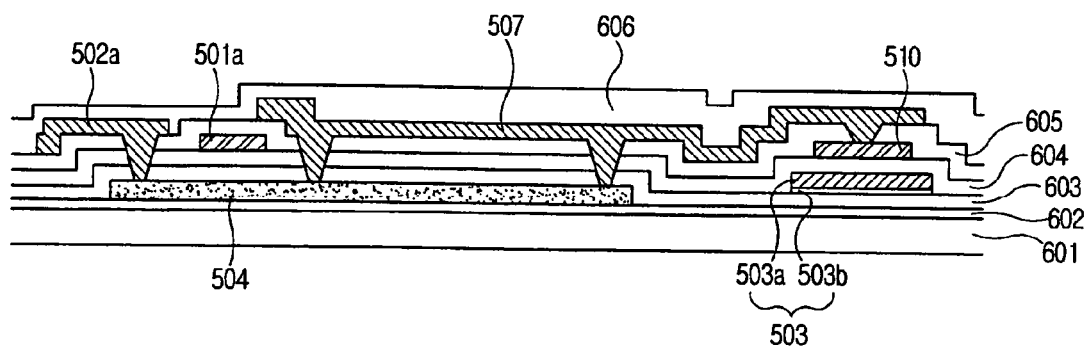

Referring to FIG. 7E, a fourth insulating layer 606 for covering the connection patterns and the data line 502 may formed by a PECVD method.

Figure 9A:
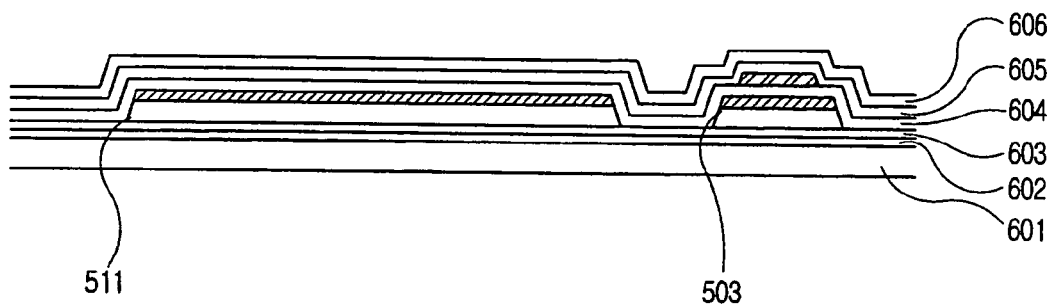
FIGS. 9A to 9C are cross-sectional views showing the method for fabricating an organic electroluminescence display device.
Figure 9B:
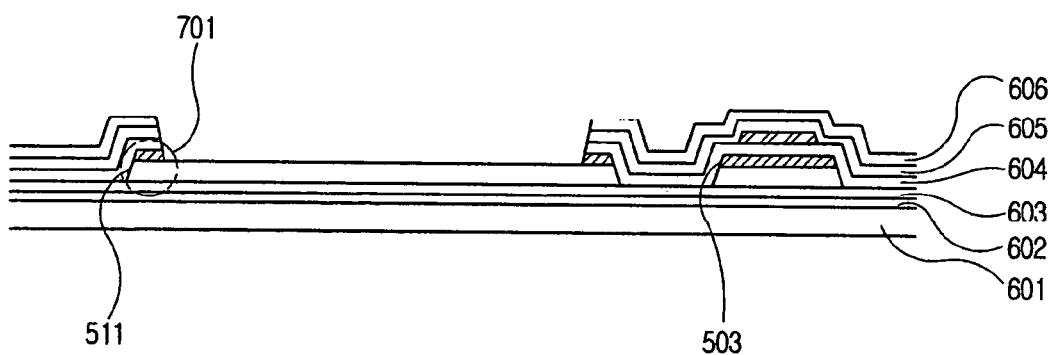
Figure 9C:
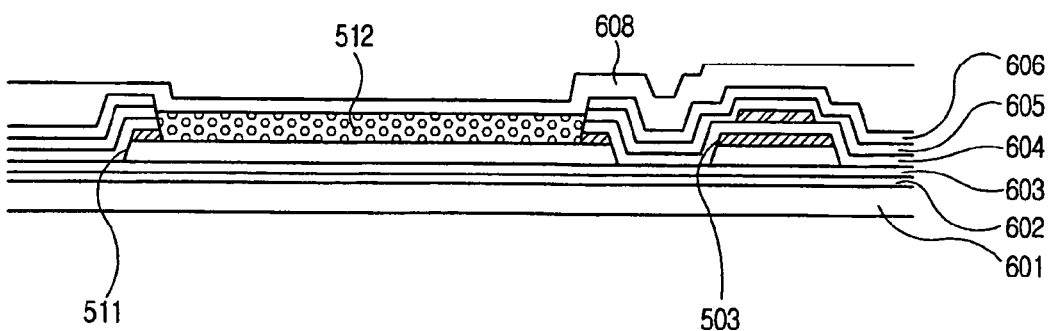

FIGS. 9A to 9C show formation of the organic electroluminescent portion including the first electrode 511.

Referring to FIG. 9A, the second, third and fourth insulating layers 604, 605, 606 formed on the first electrode 511 of the organic electroluminescence device. Portions of the first, second, and third insulating layers 604, 605, 606 and the conductive layer 511b are removed so that the transparent electrode layer of the first electrode is exposed. Referring to FIG. 9B, portions of the second, third and fourth insulating layers 604, 605, 606 may be removed by dry etching, and the conductive layer 511b may be removed by a wet etching. After the fourth insulating layer 606 is formed, exposure of the transparent electrode layer 511a of the organic electroluminescence device is performed. The conductive layer 511b of the edge of the first electrode 5111b may remain thereby forming a bank 701 with the lower transparent electrode layer 511a.

As shown in FIG. 9C, the organic electroluminescence layer 512 is formed on the transparent electrode layer 511a. Then, the second electrode 608 is formed on the organic electroluminescence layer 512 thereby completing the organic electroluminescence display device.

Figure 10A:
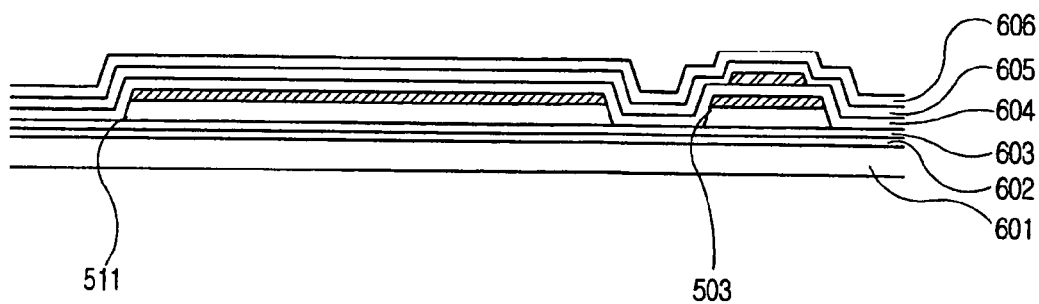
FIGS. 10A to 10C are cross-sectional views showing the method for fabricating an organic electroluminescence display device.
Figure 10B:
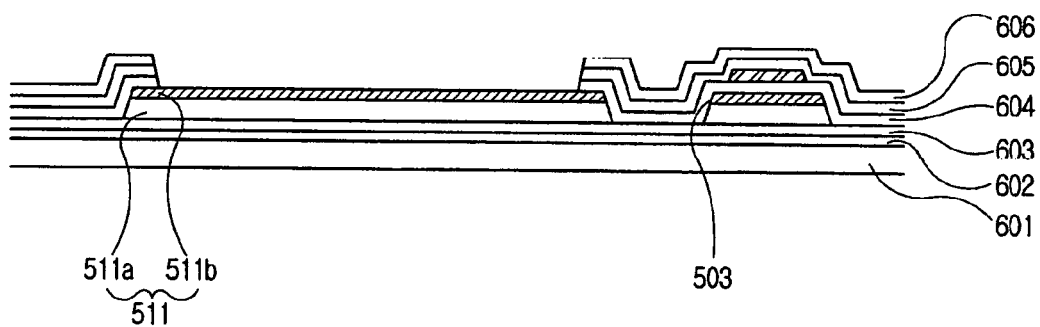
Figure 10C:
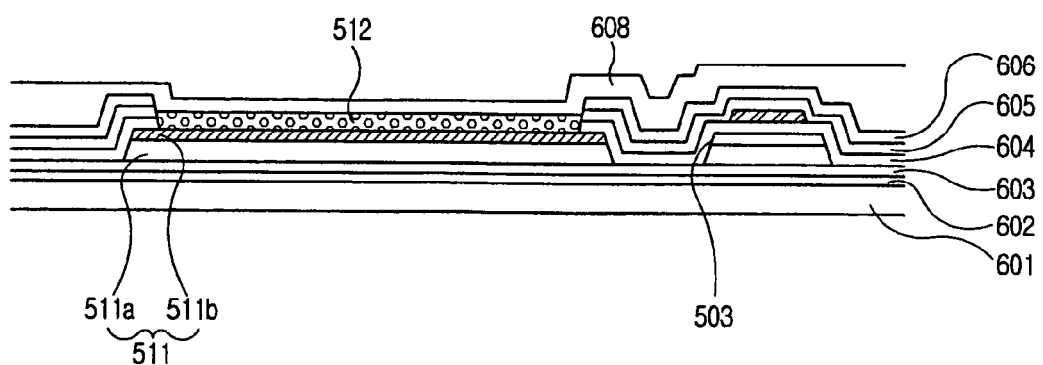

FIGS. 10A to 10C show another embodiment in formation of the organic electroluminescent portion.

Referring to FIG. 10A, the second, third and fourth insulating layers 604, 605, 606 formed on the first electrode 511 of the organic electroluminescence device. Portions of the first, second, and third insulating layers 604, 605, 606 are removed so that the conductive layer 511b of the first electrode is exposed. Referring to FIG. 10B, portions of the second, third and fourth insulating layers 604, 605, 606 may be removed by dry etching. After the fourth insulating layer 606 is formed, exposure of the conductive layer 511b of the organic electroluminescence device is performed. Accordingly, unlike the embodiment shown in FIGS. 9A-9C, the entire conductive layer 511b remains, rather than merely at edges of the first electrode 511. Thus, in this embodiment the conductive layer 511b and the transparent electrode layer 511a have substantially the same area.

As shown in FIG. 10C, the organic electroluminescence layer 512 is formed on the entire conductive layer 511b and the transparent electrode layer 511a. Then, the second electrode 608 is formed on the organic electroluminescence layer 512 thereby completing the organic electroluminescence display device.

In various embodiments, the first electrode of the organic electroluminescence device may be formed prior to formation of the first power line, and the first power line and the first electrode may be simultaneously formed on the same layer. Accordingly, the number of entire processes is reduced. Since two metal layers facing each other are used as the storage electrode in the present invention, the storage capacitor can be obtained more stably than in the conventional method using a metal layer and a silicon layer. The number of masks and the number of photolithographic processes are also reduced.

Although the present invention has been explained by way of the examples described above, it should be understood to the ordinary skilled person in the art that the invention is not limited to the examples, but rather that various changes or modifications thereof are possible without departing from the spirit of the invention. Accordingly, the scope of the invention shall be determined only by the appended claims and their equivalents.

What is claimed is:

1. An organic electroluminescence display device, comprising:
    a first substrate having a power line disposed thereon;
    a second substrate opposing the first substrate;
    an organic electroluminescent layer disposed between the first and second substrates, the organic electroluminescent layer disposed between a first electrode and a second electrode, wherein the power line comprises a plurality of conductive layers;
    a first connection pattern connecting a drain of a switching device, a gate electrode of a semiconductor driving device, and a storage electrode;
    a second connection pattern connecting the power line to a source of the semiconductor driving device; and
    a third connection pattern connecting a drain of the semiconductor driving device to the first electrode,
    wherein the first connection pattern, the second connection pattern, the third connection pattern, and a data line are formed of a same material and are formed at a same layer.

2. The device of claim 1, wherein the first electrode comprises a transparent layer.

3. The device of claim 2, wherein the first electrode further comprises an opaque layer.

4. The device of claim 3, wherein the opaque layer is formed at a peripheral portion of the organic electroluminescent layer substantially surrounding a periphery of the organic electroluminescent layer.

5. The device of claim 4, wherein the opaque layer is formed only at the peripheral portion.

6. The device of claim 5, wherein the first electrode is disposed closer to the first substrate than the second electrode.

7. The device of claim 3, wherein the opaque layer has substantially the same area as the transparent layer.

8. The device of claim 1, wherein the first electrode and the power line comprise the same conductive layers.

9. The device of claim 2, wherein the second electrode comprises an opaque layer.

10. The device of claim 9, wherein the first electrode is disposed closer to the first substrate than the second electrode.

11. The device of claim 10, wherein the first electrode further comprises an opaque layer.

12. The device of claim 11, wherein the opaque layer is formed at a peripheral portion of the organic electroluminescent layer substantially surrounding a periphery of the organic electroluminescent layer.

13. The device of claim 12, wherein the opaque layer is formed only at the peripheral portion.

14. The device of claim 1, wherein a gate line, a gate electrode, and a storage electrode are formed on the first substrate, the gate line, gate electrode and storage electrode are formed of the same material and are formed at the same layer.

15. The device of claim 14, wherein the storage electrode is disposed over the power line, an insulating layer being disposed therebetween.

16. The device of claim 1, wherein a data line is connected to a source of the switching device and the first connection pattern is connected to the storage electrode.

17. A method for fabricating an organic electroluminescence display device, the method comprising:
    forming a power line and a first electrode comprising the same multilayer structure on a substrate;
    forming an insulating layer covering the power line and the first electrode;
    forming an organic electroluminescence layer on the first electrode; and
    forming a second electrode on the organic electroluminescence layer;
    forming a first connection pattern connecting a drain of a switching device, a gate electrode of a semiconductor driving device, and a storage electrode;
    forming a second connection pattern connecting the power line to a source of the semiconductor driving device; and
    forming a third connection pattern connecting a drain of the semiconductor driving device to the first electrode,
    wherein the first connection pattern, the second connection pattern, the third connection pattern, and a data line are formed of a same material and are formed at a same layer.

18. The method of claim 17, wherein the first electrode comprises a transparent layer.

19. The method of claim 18, wherein the first electrode further comprises an opaque layer.

20. The method of claim 19, wherein the opaque layer has substantially the same area as the transparent layer.

21. The method of claim 19, wherein the opaque layer is formed at a peripheral portion of the organic electroluminescent layer substantially surrounding a periphery of the organic electroluminescent layer.

22. The method of claim 21, wherein the opaque layer is formed only at the peripheral portion.

23. The method of claim 22, wherein the first electrode is disposed closer to the substrate than the second electrode.

24. The method of claim 18, wherein the second electrode comprises an opaque layer.

25. The method of claim 24, wherein the first electrode is disposed closer to the substrate than the second electrode.

26. The method of claim 25, wherein the first electrode further comprises an opaque layer.

27. The method of claim 26, wherein the opaque layer is formed at a peripheral portion of the organic electroluminescent layer substantially surrounding a periphery of the organic electroluminescent layer.

28. The method of claim 27, wherein the opaque layer is formed only at the peripheral portion.

29. The method of claim 17, further comprising forming a gate line, a gate electrode, and a storage electrode of the same material and at the same layer on the substrate.

30. The method of claim 29, wherein the storage electrode is disposed over the power line, an insulating layer being disposed therebetween.

31. The method of claim 17, wherein a data line is connected to a source of the switching device and the first connection pattern is connected to the storage electrode.

32. A method for fabricating an organic electroluminescence display device, the method comprising:
    forming a buffer layer on a substrate;
    forming a first active pattern and a second active pattern on the buffer layer;
    forming a first insulating layer covering the first and second active patterns;
    forming a first power line and a first electrode layer, the first electrode layer comprising a transparent layer and an opaque layer;
    forming a second insulating layer covering the first and second active patterns, the first power line, and the first electrode layer;
    forming a gate line, a first gate electrode formed on the second active pattern,
    forming a storage electrode on the second insulating layer, overlapped with the first power line;
    forming a third insulating layer covering the gate line, the first gate electrode, and the storage electrode;
    forming contact holes exposing portions of the first and second active patterns, the storage electrode, the first gate electrode, the first power line, and the first electrode layer;
    forming a data line connected to a source of the first active pattern, a first connection pattern connecting a drain of the first active pattern, the storage electrode, and the first gate electrode, a second connection pattern connecting the first power line to a source of the second active pattern, and a third connection pattern connecting a drain of the second active pattern to the first electrode layer, wherein the first connection pattern, the second connection pattern, the third connection pattern, and a data line are formed of a same material and are formed at a same layer;
    forming a fourth insulating layer covering the first, second, and third connection patterns;
    exposing the first electrode layer by removing a portion of all insulating layers covering the first electrode layer;
    forming an organic electroluminescence layer on the exposed portion of the first electrode layer; and
    forming a second electrode layer on the organic electroluminescence layer.

33. The method of claim 32, wherein forming the first power line and the first electrode layer comprises:
    forming a transparent electrode layer on the substrate;
    forming a conductive electrode layer on the transparent electrode layer; and
    patterning the transparent electrode layer and the conductive layer to form the first power line and the first electrode layer.

34. The method of claim 32, wherein exposing the first electrode layer comprises:
    removing the second, third and fourth insulating layers disposed above a portion of the opaque layer; and
    removing the portion of the opaque layer, thereby exposing the transparent layer such that the organic electroluminescence layer is formed on the transparent layer.

35. The method of claim 34, wherein the second electrode layer comprises an opaque layer.

36. The method of claim 32, wherein exposing the first electrode layer comprises removing the second, third and fourth insulating layers disposed above a portion of the opaque layer, thereby exposing the opaque layer such that the organic electroluminescence layer is formed on the opaque layer.

37. The method of claim 36, wherein the second electrode layer comprises a transparent layer.

38. The method of claim 32, further comprising ion-doping the first active pattern and the second active pattern by using the gate line and the first gate electrode as a mask.

39. The method of claim 32, wherein forming the first active pattern and the second active pattern comprises:
    forming an amorphous silicon layer on the buffer layer;
    crystallizing the amorphous silicon layer; and
    patterning the crystallized silicon layer.

* * * * *